US009576635B2

(12) United States Patent
Dieny

(10) Patent No.: US 9,576,635 B2
(45) Date of Patent: Feb. 21, 2017

(54) THERMALLY-ASSISTED MAGNETIC WRITING DEVICE

(71) Applicant: COMMISSARIAT A L'ENERGIE ATOMIQUE ET AUX ENERGIES ALTERNATIVES, Paris (FR)

(72) Inventor: Bernard Dieny, Lans en Vercors (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/391,570

(22) PCT Filed: Apr. 9, 2013

(86) PCT No.: PCT/FR2013/050764
§ 371 (c)(1),
(2) Date: Oct. 9, 2014

(87) PCT Pub. No.: WO2013/153321
PCT Pub. Date: Oct. 17, 2013

(65) Prior Publication Data
US 2015/0063019 A1    Mar. 5, 2015

(30) Foreign Application Priority Data

Apr. 10, 2012  (FR) .................................... 12 53251

(51) Int. Cl.
*G11C 11/16*     (2006.01)
*G11C 11/15*     (2006.01)
(Continued)

(52) U.S. Cl.
CPC .......... *G11C 11/1675* (2013.01); *G11C 11/15* (2013.01); *G11C 11/155* (2013.01);
(Continued)

(58) Field of Classification Search
CPC ........ G11C 11/16; G11C 11/15; H01L 27/228
(Continued)

(56) References Cited

U.S. PATENT DOCUMENTS 6,269,018 B1 * 7/2001  Monsma ................. G11C 11/15
                                                    257/E27.005
6,654,278 B1 * 11/2003 Engel ...................... G11C 11/16
                                                             365/158

(Continued)

FOREIGN PATENT DOCUMENTS

EP    2 276 034    1/2011
FR    2 817 999    6/2002

OTHER PUBLICATIONS

Sort, J., et al., "Imprinting Vortices into Antiferromagnets," Letters, vol. 97, No. 6, Aug. 2006, pp. 1-4.
(Continued)

*Primary Examiner* — Hoai V Ho
*Assistant Examiner* — Roberto Mancera
(74) *Attorney, Agent, or Firm* — Pillsbury Winthrop Shaw Pittman LLP

(57) ABSTRACT

A thermally-assisted magnetic writing device includes at least one magnetic element including: a reference layer having a stable vortex magnetization configuration; a device to create a magnetic field to reversibly move the vortex core in the plane of the reference layer; a storage layer having a variable magnetization configuration; a non-magnetic spacer that separates and magnetically decouples the reference layer and the storage layer; an antiferromagnetic pinning layer in contact with the storage layer, the antiferromagnetic layer being capable of pinning the magnetization configuration of the storage layer, the storage layer having at least two storage levels corresponding to two pinned magnetization configurations; a device to heat the antiferromagnetic pinning layer such that when heated, the temperature of the (Continued)

antiferromagnetic pinning layer exceeds its blocking temperature such that the magnetization configuration of the storage layer is no longer pinned when warm.

17 Claims, 8 Drawing Sheets

(51) Int. Cl.
*G11C 11/56* (2006.01)
*G11C 11/155* (2006.01)

(52) U.S. Cl.
CPC ........ *G11C 11/161* (2013.01); *G11C 11/1673* (2013.01); *G11C 11/5607* (2013.01)

(58) Field of Classification Search
USPC .................................. 365/158, 173; 257/295
See application file for complete search history.

(56) References Cited

U.S. PATENT DOCUMENTS

| | | | | |
|---|---|---|---|---|
| 7,057,862 B2* | 6/2006 | Kasiraj | ................... | G11B 5/39 360/324.12 |
| 7,072,208 B2* | 7/2006 | Min | ................... | G11C 11/16 365/158 |
| 7,764,454 B2* | 7/2010 | Roshchin | ................ | G11B 5/02 360/59 |
| 7,868,404 B2* | 1/2011 | Deak | ................ | B82Y 25/00 257/421 |
| 7,898,849 B2* | 3/2011 | Clinton | ................... | G11C 11/16 365/130 |
| 7,936,597 B2* | 5/2011 | Clinton | ................... | G11C 5/02 365/130 |
| 8,094,487 B2* | 1/2012 | Kim | ................... | G11C 11/16 365/158 |
| 8,208,295 B2* | 6/2012 | Dieny | ................... | B82Y 25/00 365/158 |
| 8,514,618 B2* | 8/2013 | Lombard | ................ | G11C 11/16 365/148 |
| 2004/0061981 A1* | 4/2004 | Covington | ............ | B82Y 25/00 360/324.1 |
| 2007/0247901 A1* | 10/2007 | Akinaga | ................ | B82Y 25/00 365/173 |
| 2007/0297219 A1* | 12/2007 | Dittrich | ................... | G11C 11/16 365/158 |
| 2008/0180989 A1 | 7/2008 | Baek et al. | | |
| 2009/0147567 A1* | 6/2009 | Chen | ................... | G11C 11/15 365/173 |
| 2011/0110151 A1* | 5/2011 | Prejbeanu | ............ | B82Y 25/00 365/173 |
| 2012/0241827 A1* | 9/2012 | Daibou | ................ | H01L 27/228 257/295 |
| 2013/0070522 A1* | 3/2013 | Saida | ...................... | G11C 11/16 365/173 |
| 2013/0154035 A1* | 6/2013 | Krounbi | ................. | H01L 43/08 257/421 |

OTHER PUBLICATIONS

Konstantin, L., et al., "Map of metastable states for thin circular magnetic nanocylinders," Applied Physics Letters, vol. 92, No. 11, 2008, pp. 1-3.

International Search Report issued for International Application No. PCT/FR2013/050764, dated Jul. 11, 2013.

* cited by examiner

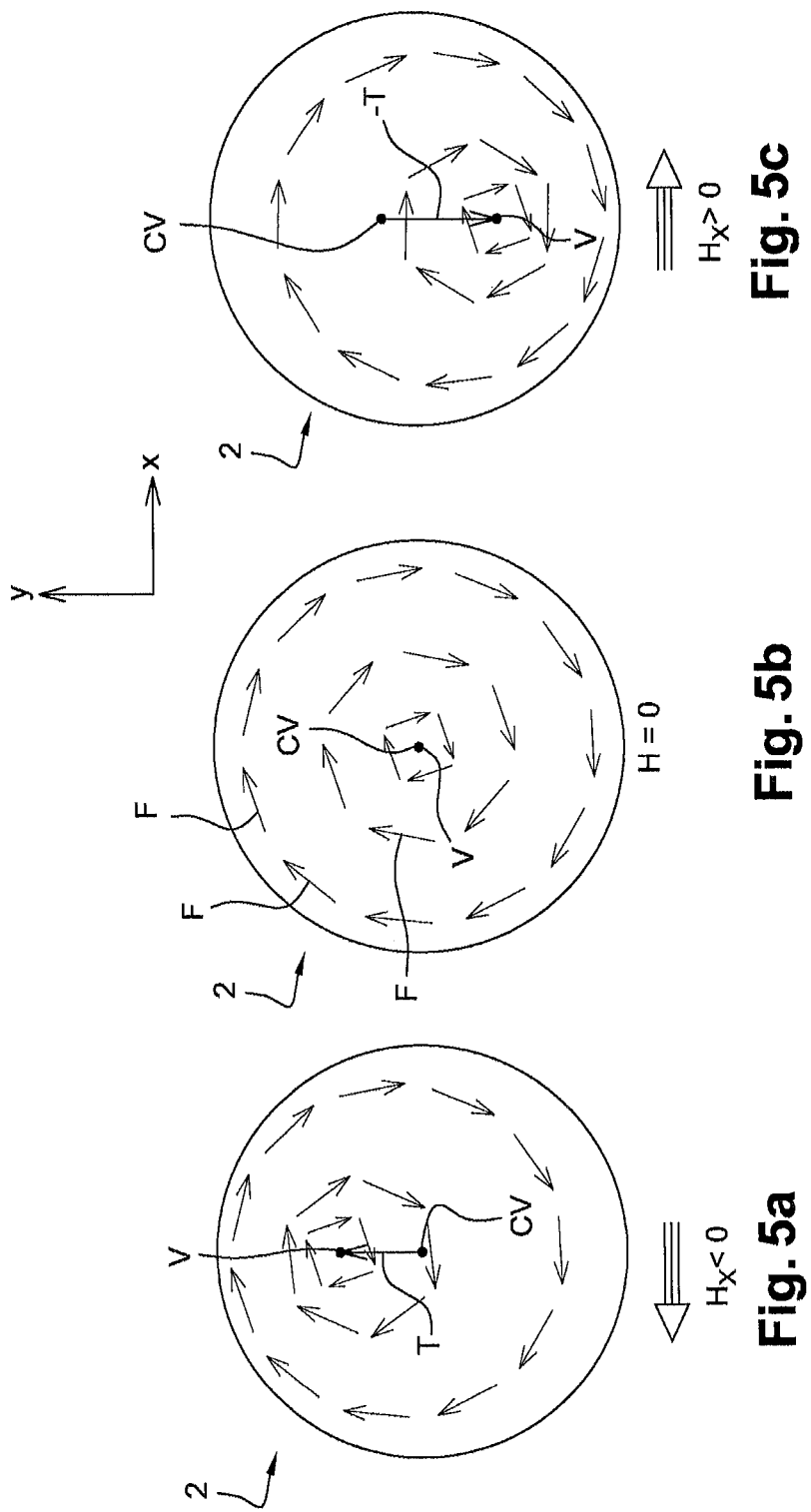

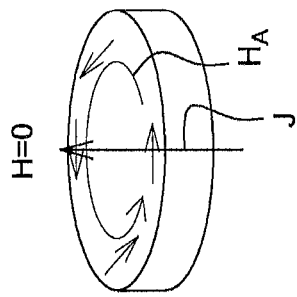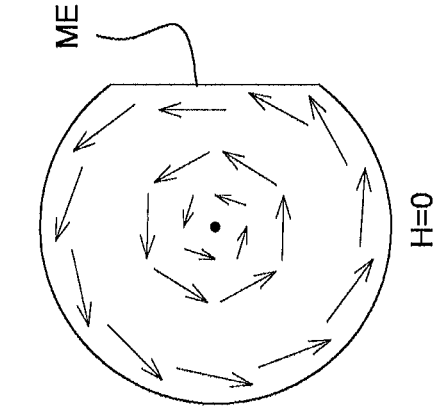
Fig. 6c  Fig. 7c
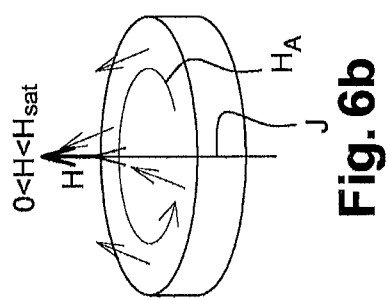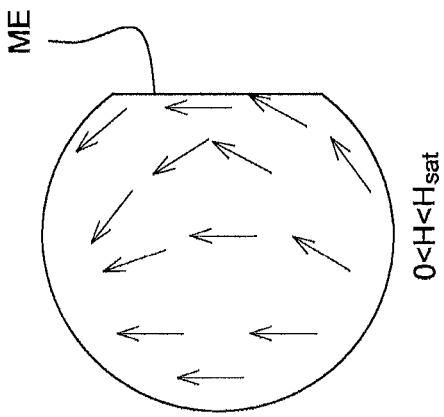
Fig. 6b  Fig. 7b
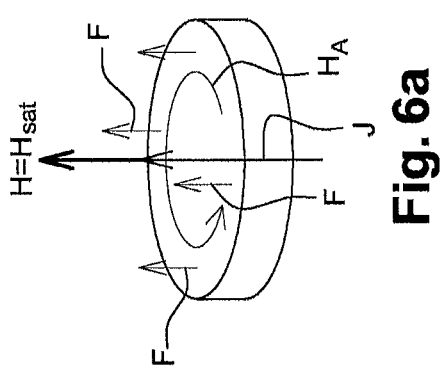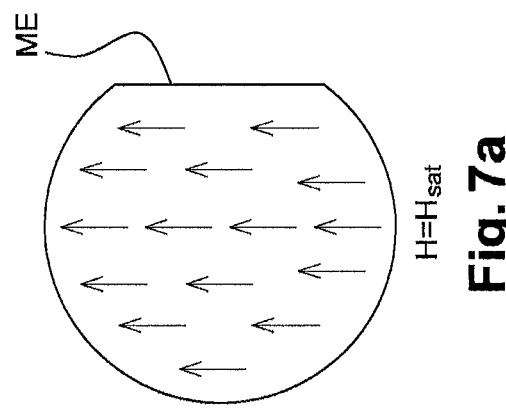
Fig. 6a  Fig. 7a

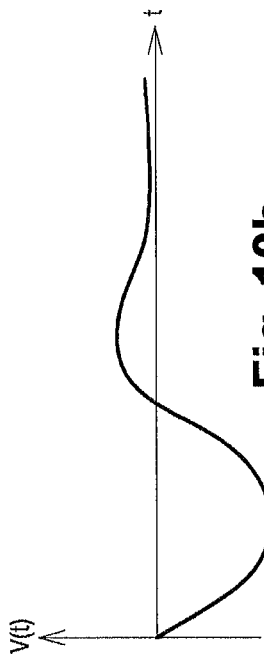
Fig. 10a
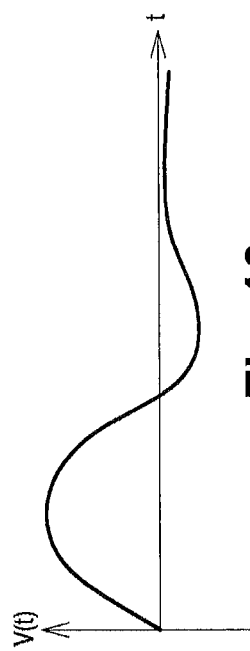
Fig. 10b
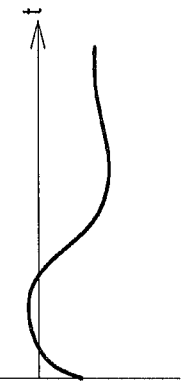
Fig. 11c
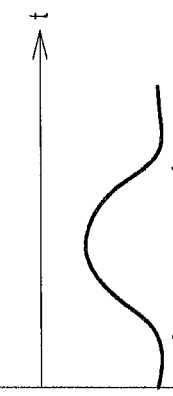
Fig. 11b
Fig. 11a

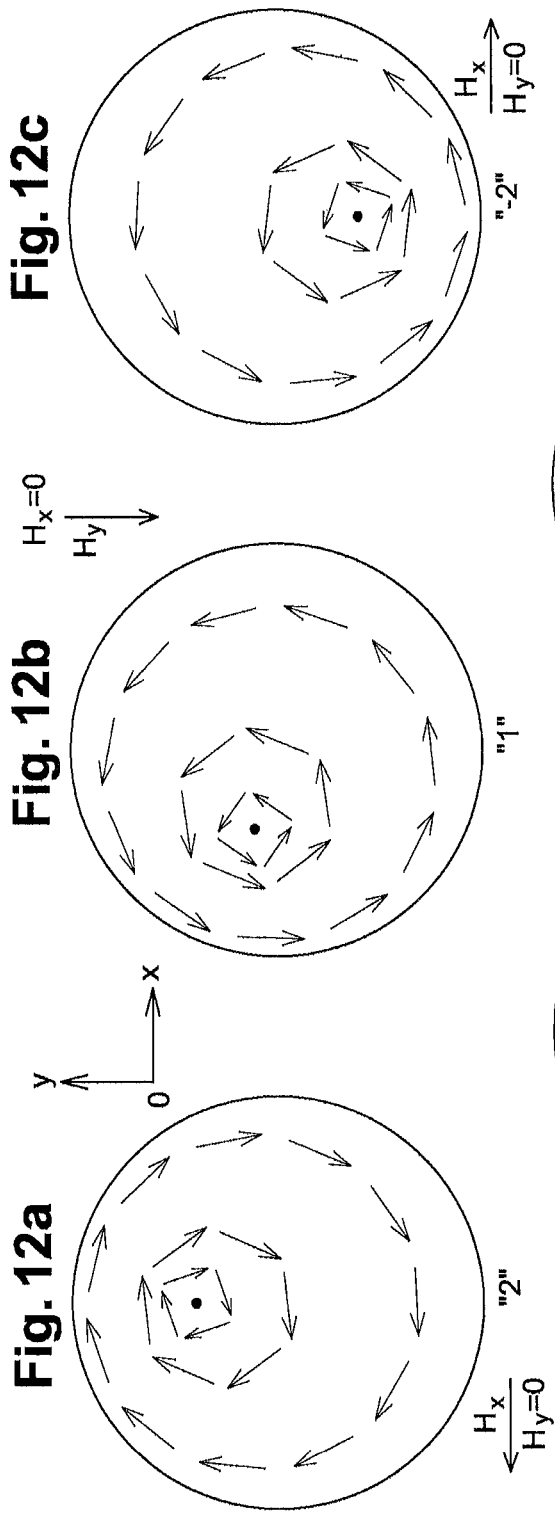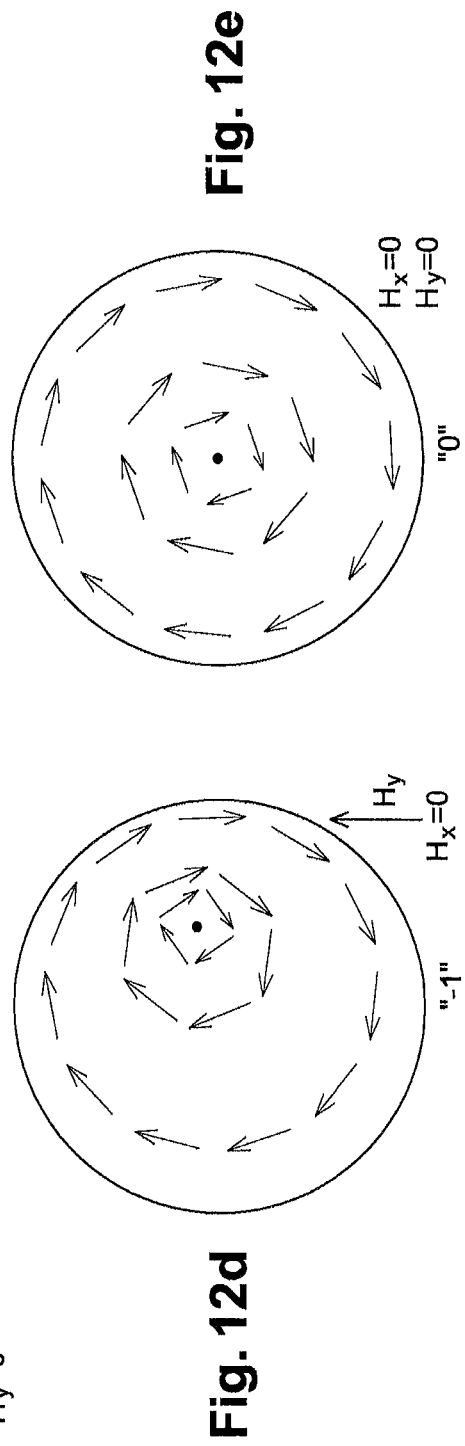

THERMALLY-ASSISTED MAGNETIC WRITING DEVICE

CROSS REFERENCE TO RELATED APPLICATIONS

This application is the U.S. National Stage of PCT/FR2013/050764, filed Apr. 9, 2013, which in turn claims priority to French Patent Application No, 1253251 filed Apr. 10, 2012, the entire contents of all applications are incorporated herein by reference in their entireties.

This invention relates to an MRAM (Magnetic Random Access Memory) type magnetic device or a logic element (Magnetic Logic Unit) based on magnetoresistive magnetic elements with thermally-assisted writing.

MRAM magnetic memories are attracting new interest with the development of magnetic tunnel junctions with high magnetoresistance at ambient temperature. MRAM memories usually have several memory points. These memory points are usually magnetic devices that comprise:
- a magnetic layer called the "reference layer" for which the magnetisation direction is fixed;
- a magnetic layer called the "storage layer" for which the magnetisation direction is variable and that can be oriented parallel to or anti-parallel to the magnetisation direction of the reference layer;
- a spacer made from an insulating or semiconducting material that separates the reference layer from the storage layer.

For example, document FR2817999 discloses such a magnetic device, Each memory point has two operating modes, namely a "read" mode and a "write" mode. In write mode, an electron current is sent through the layers or a magnetic field is applied to the storage layer of the memory point, so as to change the magnetisation direction of the storage layer which then becomes parallel or anti-parallel to the magnetisation direction of the reference layer. A "1" or a "0" will be stored in the storage layer depending on whether the magnetisation direction of the storage layer is parallel or anti-parallel to the magnetisation direction of the reference layer.

In read mode, an electron current is injected through the memory point so as to read its resistance. When the magnetisation directions of the reference layer and the storage layer are parallel, the resistance of the memory point is low, and when the magnetisation directions of the reference and storage layers are anti-parallel, the resistance of the memory point is high. The value stored in the storage layer ("0" or "1") can be determined by making a comparison with a reference resistance.

However, the values of the resistances when the reference and storage layers are parallel or anti-parallel may vary in different memory points. Consequently, when the resistance of a memory point is compared with a standard reference value, the result of the comparison is not always representative of the real state of the memory point because of differences between this memory point and the memory point that was used to determine the standard reference value.

Magnetic devices that comprise a reference layer for which the magnetisation direction is variable have been developed to overcome this problem.

Thus, document EP2276034 discloses a magnetic device that comprises memory points, each memory point comprising:
- a storage layer;
- a spacer;
- a reference layer with a variable magnetisation direction;
- a conductor that generates a magnetic field when an electron current passes through it, and the direction of electron current can be chosen so as to control the direction of the generated magnetic field;
- means of injecting an electron current through the memory point.

This device is particularly advantageous because it is capable of reading information stored in the storage layer without needing to use a reference resistance value. This magnetic device can be used for differential reading of information contained in the storage layer making use of the reference layer.

This is done by measuring the resistance of the memory point when the magnetisation direction of the reference layer is along one sense, and then by measuring the resistance of this memory point when the magnetisation direction of the reference layer is along the other sense. The values of these two resistances are then compared to deduce the magnetisation direction of the storage layer.

This is done by applying a first magnetic field pulse to orient the magnetisation direction of the reference layer along a predetermined direction. The resistance of the memory point is then measured. The next step is to apply a second magnetic field pulse so as to orient the magnetisation direction of the reference layer along the direction opposite to the first predetermined direction. The resistance of the memory point is then measured again. The magnetisation direction of the reference layer is known after each current pulse, because the direction of the applied magnetic field pulses is known. Consequently, the resistance of the memory point after the first current pulse and after the second current pulse can be compared to deduce the magnetisation direction of the storage layer. This method of reading the information contained in the storage layer is particularly advantageous because it enables a more precise reading of information contained in the storage layer and it can give results less sensitive to fluctuations in the resistance of different memory points.

The read precision obtained is better because instead of using a standard reference value, a single memory point is put in two states and the two states are compared with each other, which can give results less sensitive to fluctuations in the resistance of different memory points. This means that a greater dispersion in resistances and magnetoresistance amplitudes can be tolerated.

This device can also be used as a logic element comprising a memory function contained in the orientation of the magnetisation of the storage layer and a logical comparison function contained in the relative orientation of the magnetisations of memory and logic layers. This element is sometimes called a Magnetic Logic Unit (MLU).

However, the device disclosed in this document requires the use of relatively high currents to generate a magnetic field capable of switching the magnetisation direction of the reference layer. When reading, the reference layer must be as soft as possible to consume the least possible energy.

Document U.S. Pat. No. 6,654,278 discloses a memory point with a reference layer with a vortex magnetic configuration; the vortex core can move very reversibly with a relatively weak field. The storage layer is a magnetic layer with strong uniaxial anisotropy with an axis of easy magnetisation. This uniaxial anisotropy is a shape anisotropy obtained by giving the element an elongated elliptical shape.

Even if the memory point in document U.S. Pat. No. 6,654,278 is presented as being relatively stable, there is a risk of accidental writing when reading information contained in the storage layer, particularly if the density of memory points is high. Furthermore, this type of memory point has a relatively low capacity for keeping written information in the long term (poor retention). Moreover, this type of memory point can only store one information bit because there are only two stable magnetisation states of the storage layer at rest, in other words when not being written.

Furthermore, it is not easy to fabricate this memory point because the reference layer requires a relatively low shape factor (typically between 1 and 1.3) so that its magnetisation can be in the vortex configuration while the storage layer needs an elongated shape (shape factor typically from 1.7 to 2.5) so that the shape anisotropy of its magnetisation is sufficiently determinant for retention of information in the memory point. Thus, the fact of having different shapes for the different layers forming the stack considerably increases the complexity of the memory point fabrication process.

Other MRAM type magnetic memorisation devices that use a set of memory points in the vortex state are known, Document U.S. Pat. No. 7,072,208 discloses such an MRAM device comprising a magnetic tunnel junction including a free layer and a reference layer separated by a tunnel barrier, each of the two layers being in a vortex state. This device uses the chirality c of the rotating magnetisation (fixed in the case of the reference layer and variable in the clockwise and anticlockwise directions in the case of the free layer) to measure the variation of resistance and to determine binary information ("0" or "1"). The magnetisation orientation (clockwise or anticlockwise) is changed by applying a large amplitude static field. However, such a device is fairly complicated to obtain and requires a large amount of energy for the write phase and to invert the chirality of the magnetisation. Furthermore, this change of chirality of magnetisation of the storage layer requires application of two successive magnetic field pulses with well controlled intensity and duration to induce the appropriate magnetisation dynamics to invert the chirality, or sufficiently separated in time to enable quasi-static switching of the chirality. In each case, this increases the complexity or slows the information writing process.

Furthermore, these devices can only store one bit for each magnetoresistive element represented by the two possible magnetisation chiralities of the vortex formed by magnetisation of the storage layer.

Moreover, in some embodiments of the device in document U.S. Pat. No. 7,072,208, the memory element has an asymmetric elliptical shape composed of two half-ellipses adjacent to each other with different length minor axes. It is technologically difficult using the most advanced technological nodes to produce such an element and the elliptical shape tends to reduce the density of memory points that can be stored on a chip in comparison with a near cylindrical shape.

The invention aims to overcome the disadvantages of the state of the art by disclosing a magnetic device in which the magnetisation direction of the reference layer can be switched using very low currents while limiting the risk of accidentally writing on the storage layer, particularly in the presence of a high density of associated memory points.

To achieve this, the invention relates to a thermally-assisted magnetic writing device comprising at least one magnetic element including:
  a first magnetic layer called the "reference layer", the reference layer having a stable vortex magnetisation configuration;
  means of creating a magnetic field to reversibly move the vortex core in the plane of said reference layer;
  a second magnetic layer called the "storage layer", this storage layer having a variable magnetisation configuration;
  a non-magnetic spacer that separates and magnetically decouples the reference layer and the storage layer;
  an antiferromagnetic pinning layer in contact with the storage layer, this antiferromagnetic layer being capable of pinning the magnetisation configuration of the storage layer, said storage layer having at least two storage levels corresponding to two pinned magnetisation configurations;
  means of heating said antiferromagnetic pinning layer such that when heated, the temperature of said antiferromagnetic pinning layer exceeds its blocking temperature such that the magnetisation configuration of said storage layer is no longer pinned when warm.

The magnetic element may be a memory point or a logic unit.

A vortex state means a coherent magnetic configuration in micro or nano magnetic structures with magnetisation in the plane of the layers with magnetisation rotations on a length scale comparable to the lateral dimension of the surface of the layer concerned. The magnetisation vortex state results from an equilibrium between magnetostatic energy and exchange energy for cylindrical or near-cylindrical shaped micro or nano structures in magnetic layers, for which the radius and thickness are sufficiently large. For these layers, the vortex state represents the magnetic configuration with the lowest energy.

A stable vortex configuration means that the vortex can deform reversibly but it is not cancelled and the chirality does not change under normal operating conditions;

"Reversible" means that the vortex can deform reversibly under a moderate magnetic field, the part of the vortex magnetisation parallel to the applied field tending to become larger and the part of the magnetisation anti-parallel to the applied field tending to become smaller. This causes displacement of the vortex core along the direction transverse to the direction of the applied field. When the magnetic field reduces, the vortex core gradually returns to its equilibrium position in zero field. The equilibrium position of the vortex core in the case of a disk-shaped microstructure or nanostructure is at the centre of the disk.

A magnetic layer in a vortex state has a spatially non-homogeneous magnetic configuration (i.e. the orientation of the magnetisation is different depending on the location inside the layer). FIG. 1 shows the orientation of the magnetisation on a magnetic layer C in a vortex state, the layer in this case being circular in shape. It can be seen that the magnetisation (the magnetisation vectors are shown by arrows) is located in the plane of the layer and rotates either in the clockwise direction or in the anticlockwise direction (the clockwise direction is shown in the figure). Magnetisation spontaneously adopts a circular configuration resulting from minimisation of the global energy of the system including the exchange energy that tends to keep the magnetisation parallel everywhere and the magnetostatic energy that tends to minimise the radiated field outside the layer. Therefore, there is a first degeneration of the magnetisation of a layer in a vortex state called the chirality c, the sign of which ($c=\pm 1$) depends on the direction along which magnetisation rotates in the plane. A singularity is also observed at the centre of the cell (in a zone V called the "vortex core") in which magnetisation can no longer rotate over a very short length scale due to the excessive cost in exchange energy associated with such rotation. The dimensions of this central zone V are approximately equal to the characteristic exchange length $L_E$ defined as being the length characterising competition between exchange energy and magnetostatic energy. Magnetisation in this vortex core zone V tends to project upwards perpendicular to the plane of the cell (it is said that the magnetisation or core polarity p is equal to +1) or downwards (in this case it is said that the magnetisation or core polarity p is equal to −1), Therefore, a second degeneration of the cell in the vortex state is observed depending on whether the magnetisation of the vortex core perpendicular to the plane of the cell is upwards (p=+1) or downwards (p=−1). However, this exchange length is usually very short (typically a few nanometers). In this description, the surface area of the memory point occupied by this magnetisation singularity is negligible such that the influence of this singularity on the magnetic and magnetoresistance properties of the element considered can be neglected.

According to the invention, the reference magnetic layer must be in a stable vortex configuration. To achieve this, the configuration must be exclusively vortex with no risk of having any other types of magnetic configuration, for example such as a single domain "leaf" type configuration, a "C" type configuration, an out-of-plane magnetic configuration or the possibility of coexistence of several of these configurations (including the coexistence of a vortex configuration and a non-vortex configuration). The conditions for the presence of a stable vortex state of a magnetic layer are described particularly in the document "Map of metastable states for thin circular magnetic nanocylinders" (Konstantin et al.—Applied Physics Letters 92, 112506-2008); FIG. 2 shows the distribution of the types of magnetic configurations obtained by varying the $R/L_E$ ratio (where R is the radius of the circular magnetic layer for which the magnetic configuration is characterised and $L_E$ is the characteristic exchange length) depending on the $L/L_E$ ratio (where L is the thickness of said layer), in an approximately cylindrical magnetic layer. It can be seen that the radius and the thickness of the layer must be chosen to be within a region in which only the vortex configuration is possible, on the graph corresponding to the entire region denoted RV above and to the right of the cross-hatched areas (for example point M corresponding to an $R/L_E$ value equal to 1.4 and an $L/L_E$ value equal to 3 or point N corresponding to a $R/L_E$ value equal to 3 and an $L/L_E$ value equal to 2.5). In FIG. 2, it can be seen that depending on the values chosen, it is possible to have a single domain configuration (RM region), a vortex configuration (RV region), an out-of-plane configuration (RH region), the coexistence of single domain and vortex configurations, the coexistence of vortex and "C" type configurations, the coexistence of out-of-plane and vortex configurations or the coexistence of type "C" and vortex configurations.

In configurations known in the state of the art in which a reference layer close to a single domain state is used, reading is done by switching this reference layer from a given orientation to approximately the opposite orientation. Even in the best case in which an attempt is made to make quasi-cylindrical shaped pillars, this switching requires fields of several Oe (typically 50 to 100Oe) because there are always edge defects that appear during the tunnel junction etching process that tend to hinder the rotation of magnetisation and can even induce uncontrolled micromagnetic states that can even lead to read errors. On the other hand, the stable vortex configuration used according to the invention is an elastically deformable configuration as long as it is located within the region in which the vortex deforms without being cancelled (in other words in the range between + and − the cancellation field), It can be deformed by application of a weak field, obviously knowing that the deformation will be smaller when the field is weaker (like an elastic that stretches less when the applied tension is low). However, regardless of the produced vortex deformation, it will generate a variation in the electrical resistance proportional to the deformation and therefore to the applied field. Therefore if the detection circuit is sufficiently sensitive, it will be possible to work with very weak fields, typically of the order of 30 to 50Oe. On the other hand, according to the state of the art, it is impossible to work if the field is too weak because if the field is less than the coercitive field of the reference layer, the reference layer will not switch and the change in resistance will not be measured.

The magnetic device may also have one or more of the following characteristics taken individually or in any technically possible combination.

according to a first embodiment, said storage layer is an essentially single domain magnetic layer (i.e. with a single magnetisation direction over the entire layer);

according to a second embodiment of the invention, the storage layer has a stable vortex magnetisation configuration;

the vortices of said reference layer and said storage layer have the same chirality;

said storage layer has more than two storage levels, each storage level corresponding to a pinned magnetisation configuration;

said storage layer has three storage levels;

said means of creating a magnetic field comprise means of creating two variable non-parallel components Hx and Hy of the magnetic field, simultaneous application of these field components Hx and Hy being capable of moving the vortex core from said storage layer in the plane of said storage layer when the storage layer is not pinned, each pair of components Hx and Hy being associated with one storage level;

the thicknesses of said reference layer and said storage layer are the same and they are made from the same material;

the device according to the invention comprises a plurality of magnetic elements each forming a memory point, the vortices of the reference layers of said memory points all having the same chirality;

for a given radius of said memory point, the thickness of said reference layer is chosen such that said reference layer has a stable vortex configuration magnetisation;

the Curie temperature of said reference layer is reduced over at least part of the thickness of this reference layer to a value of less than 900K but more than 550K.

said reference layer comprises a first sub-layer in contact with said spacer and a second sub-layer, the first sub-layer having a higher Curie temperature than the second sub-layer further from said spacer;

said reference layer is a composite layer composed of at least two sub-layers including a CoFeB sub-layer in contact with the spacer made of MgO and a sub-layer at a lower Curie temperature further from the spacer such as an NiFe or an NiFeX alloy sub-layer where X represents a non-magnetic element such as Ta, Cu, Hf, Zr, Cr, V in a proportion of the order of 2 to 20%;

said spacer is made in one of the following forms:
said spacer is a tunnel barrier;
said spacer is made in the form of an insulating layer comprising a conducting contact at its centre;
said spacer is made from a semiconducting or metallic material;

said spacer is a heterogeneous metal/oxide layer such as a layer with confined current paths composed of an insulating barrier through which conducting channels are formed;

said spacer is made in the form of an insulating layer comprising a conducting contact at its centre, said means of creating a magnetic field being adapted to move said vortex core relative to the centre of said reference layer by a distance exceeding the radius of said vortex core;

said storage layer comprises at least one stack formed from;

a layer composed of a ferromagnetic material with a cubic face-centred crystallographic structure in contact with said antiferromagnetic layer;

an amorphous or quasi-amorphous transition layer in contact with said ferromagnetic layer with a cubic face-centred crystallographic structure;

a ferromagnetic layer with a cubic face-centred crystallographic structure;

said at least one memory point is approximately cylindrical in shape.

Another purpose of this invention is a method of reading information contained in the storage layer of a magnetic device according to the invention, said storage layer having a stable vortex magnetisation configuration, said method comprising a step to apply a rotating field on the magnetisation of the reference layer, said rotating field causing oscillation of the stack resistance, and a step to determine information written in the storage layer starting from the phase and amplitude of said resistance oscillation.

Other characteristics and advantages of the invention will become clear after reading the following description with reference to the appended figures:

FIGS. 5a to 5c show the deformation of a vortex configuration under the effect of a magnetic field;

FIGS. 6a to 6c show the steps in a first embodiment of a method of initialising the chirality of the vortex in a magnetic device according to the invention;

FIGS. 7a to 7c show the steps in a second embodiment of a method of initialising the chirality of the vortex in a magnetic device according to the invention;

Figure 3:
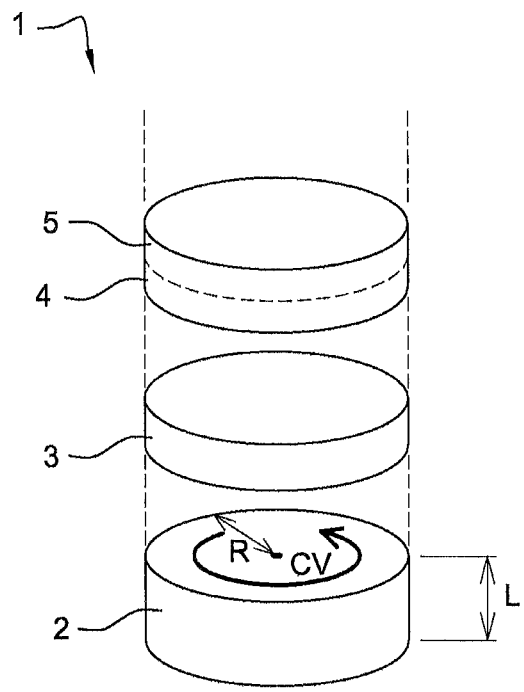
FIG. 3 shows a magnetic device according to one embodiment of the invention.
Figure 8:
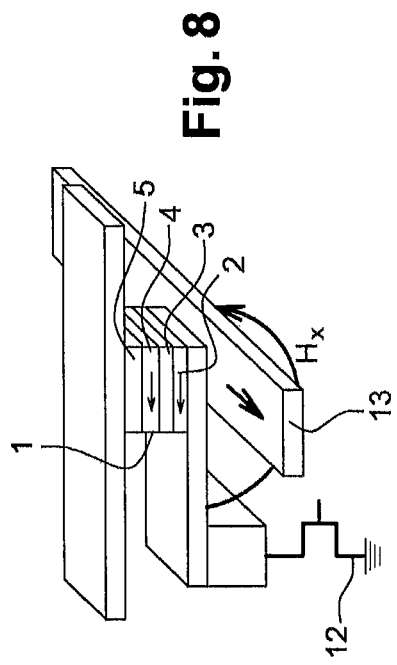
Figure 9C:
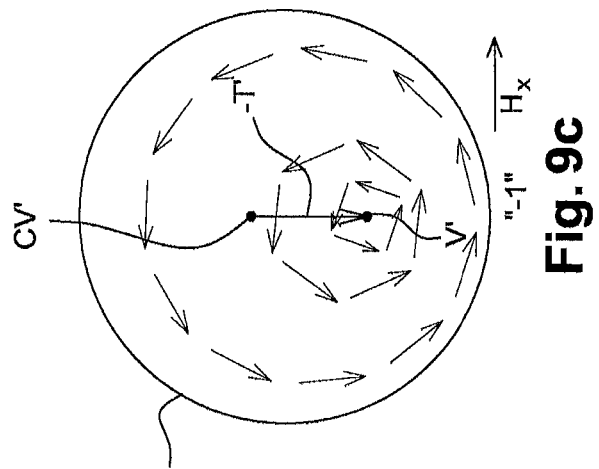
Figure 9B:
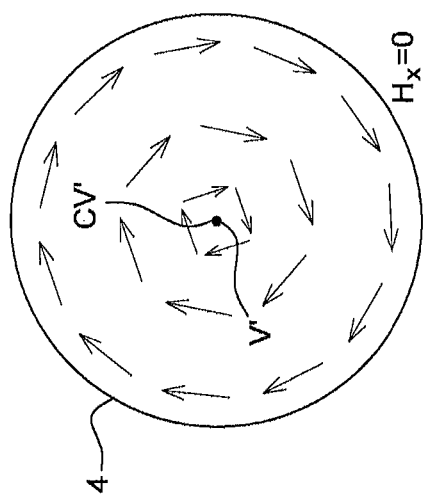
Figure 9A:
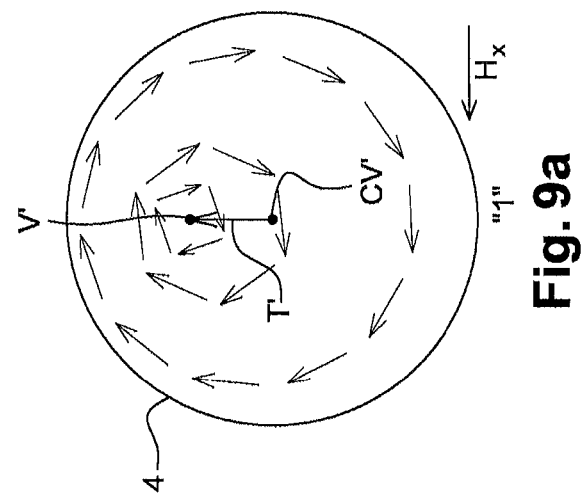
Figure 13:
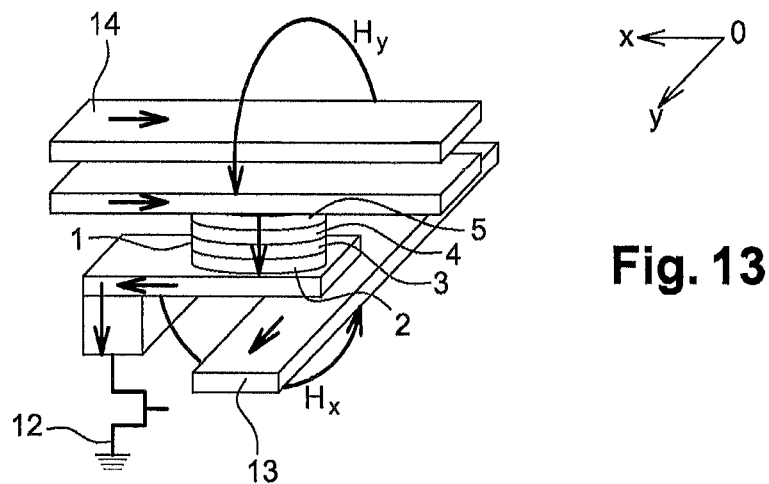
Figure 14:
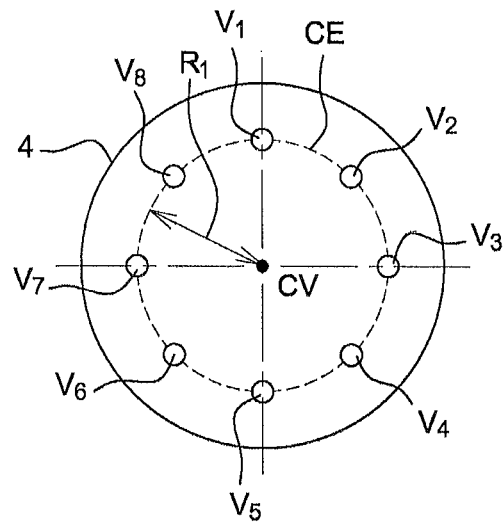
Figure 15:
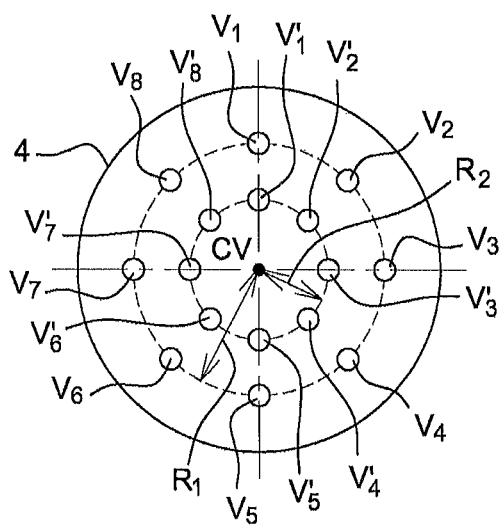

FIG. 8 diagrammatically shows read/write of the magnetic device in FIG. 3 according to a first embodiment;

FIGS. 9a to 9c show the action of a magnetic field in the case of a storage layer of the magnetic device according to the invention in an initial vortex configuration;

FIGS. 10a and 10b show examples of voltage signals obtained during dynamic reading of the magnetic device according to the invention with two storage levels;

FIGS. 11a to 11c show examples of voltage signals obtained during dynamic reading of the magnetic device according to the invention with three storage levels;

FIGS. 12a to 12e show the action of two perpendicular magnetic fields in the case of a storage layer of the magnetic device according to the invention in an initial vortex configuration;

FIG. 13 diagrammatically shows read/write of the magnetic device in FIG. 3 according to a second embodiment FIG. 14 shows the storage layer of a device according to the invention comprising eight storage states;

FIG. 15 shows the storage layer of a device according to the invention comprising 16 storage states.

Identical or similar elements are marked with identical reference signs in all figures to make the figures more easily understandable.

Figure 1:
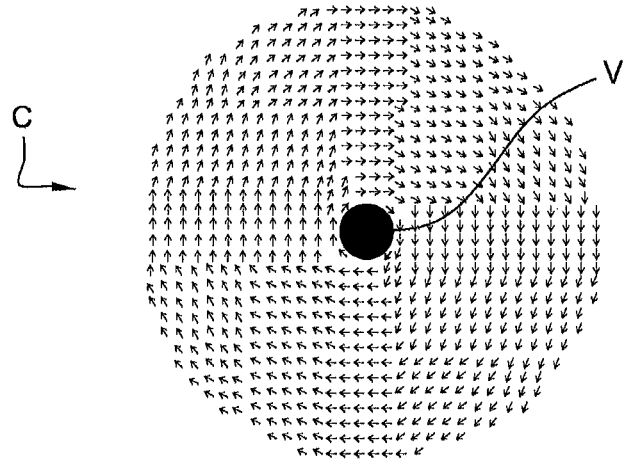
FIG. 1 shows the distribution of magnetisation on a magnetic layer C in a vortex state.

FIG. 1 shows a magnetic device 1 according to one embodiment of the invention.

This magnetic device 1 comprises a single memory point 1 but we will see in the following that the device according to the invention may comprise several memory points. The different layers in the device 1 in this case are preferably circular such that the magnetic device 1 is globally cylindrical. The magnetic device 1 may also be used as a logic unit (Magnetic Logic Unit).

Figure 2:
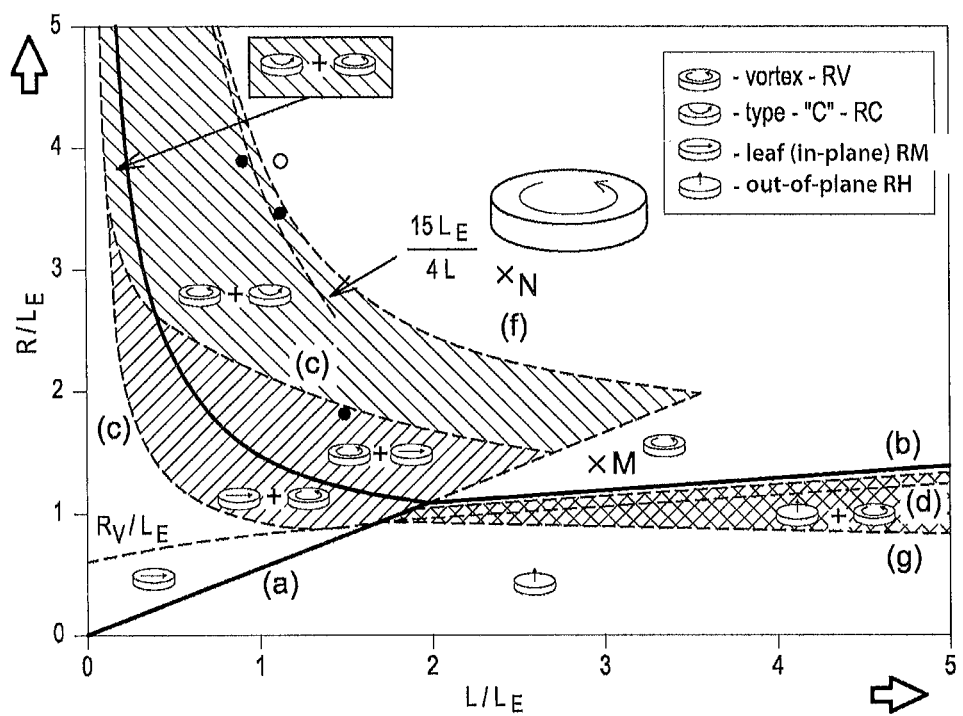
FIG. 2 shows the distribution of types of magnetic configurations obtained by varying the $R/L_E$ ratio as a function of the $L/L_E$ ratio in an approximately cylindrical magnetic layer.

This magnetic device comprises a reference layer 2. As mentioned above, the magnetic configuration of this reference layer 2 is the configuration of a stable vortex state. FIG. 2 shows that it is useful to choose the thickness L and the radius R such that the reference layer 2 is exclusively in the vortex state (i.e.

without any possible coexistence with another metastable magnetic state). The radius R is often fixed by memory point density requirements so that the thickness L is chosen such that the reference layer 2 is in the vortex region, in other words in the RV region of the diagram in FIG. 2. In practice, the exchange length $L_E$ in FIG. 2 is often of the order of a few nm (for example 5 nm in the case of NiFe) such that the $R/L_E$ ratio for radii R of the order of a few tens of nm is equal to approximately 10. Therefore, it can be seen that all that is necessary to be within the region with a stable vortex configuration is to increase the thickness of the reference layer.

The reference magnetic layer 1 may be a single layer composed of a cobalt-iron-boron alloy; nevertheless, this CoFeB layer may be associated with a Ta or Ti layer and other soft layer, for example composed of an iron-nickel alloy. The global thickness of the reference layer will always be chosen appropriately to obtain a stable vortex configuration. It will be noted that the part of the reference layer 2 in contact with the non-magnetic spacer 3 when the non-magnetic spacer is an MgO tunnel barrier, is preferably composed of a CoFeB alloy.

Figure 4:
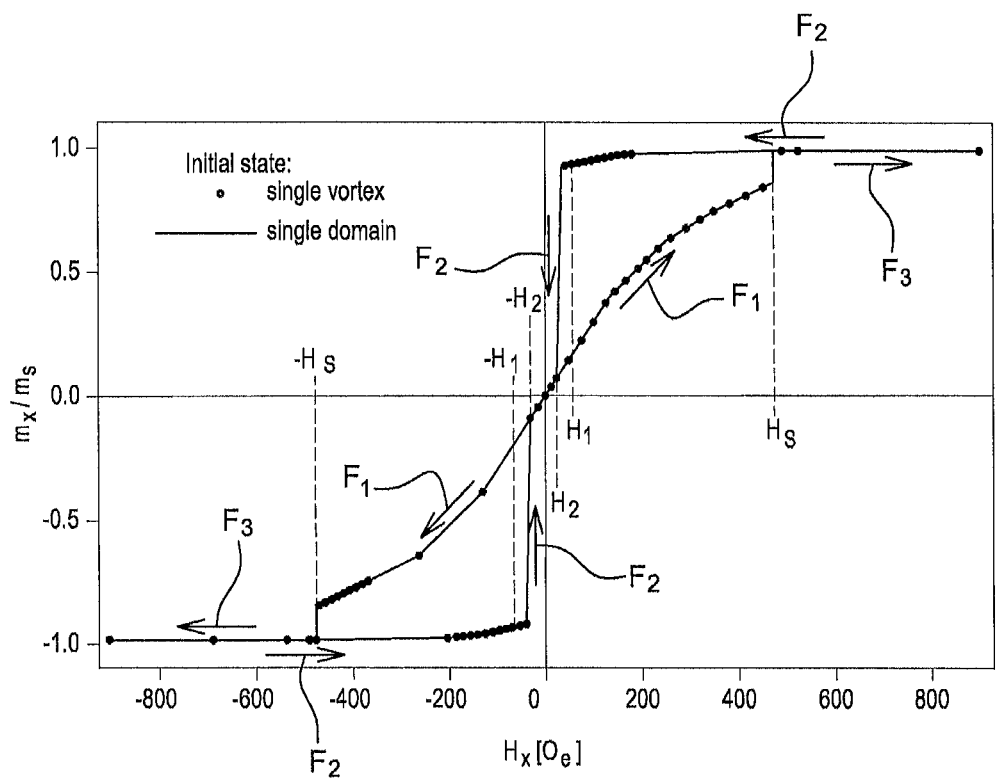
FIG. 4 shows the magnetisation variation in a magnetic layer with initially approximately cylindrical planar magnetisation in a vortex configuration under the effect of a magnetic field applied in its plane.

The vortex configuration of the reference layer 2 has a large stability zone when a magnetic field is applied to it. In other words, the vortex configuration remains present under the effect of a magnetic field by deforming elastically and very reversibly over a wide range of fields up to a certain critical field at which the vortex cancels out. This phenomenon is shown in FIGS. 4 and 5a to 5c. FIG. 4 shows the variation in the magnetisation of an initially approximately cylindrical magnetic layer in a vortex configuration under the effect of a magnetic field Hx. The magnetisation distribution in such a magnetic layer 2 is shown in FIG. 5b when the field Hx is zero.

The layer 2 in the vortex state has a spatially non-homogeneous magnetic configuration (i.e. the orientation of the magnetisation is different depending on the position), the magnetisation is located in the plane of the layer 2 and rotates either in the clockwise direction or in the anticlockwise direction (in this case arrows F show the clockwise direction), the circular behaviour of the magnetisation being explained by spontaneous minimisation of the magnetostatic energy of the layer counterbalanced by a cost in exchange energy. It is also observed that there is a singularity at the vortex centre CV in a zone V called the "vortex core", in which the magnetisation can no longer rotate over such a small spatial scale. In FIG. 5*b*, the vortex core V is coincident with the centre CV of the magnetic layer 2. As explained above, the radius of the vortex core V is equal to the exchange length $L_E$ that depends on the exchange stiffness constant and the magnetisation of the material. This radius is typically a few nanometers.

FIG. 4 shows the effect of a field Hx applied to a cylindrical-shaped magnetic layer similar to layer 2 in the device 1 according to the invention, in the general case. For a field of between −Hs and Hs (where Hs is the vortex cancellation field), the vortex configuration still exists but it is deformed elastically and reversibly (arrow F1). For a field stronger than Hs or weaker than −Hs, the vortex is cancelled and the magnetic layer changes into an essentially single domain configuration (arrow F3). When the field drops below saturation, the vortex configuration renucleates below a field with a value equal to H2 or −H2 (arrow F2) corresponding to the vortex nucleation field. Thus, there is some hysteresis with cancellation and nucleation of the vortex configuration whereas the entire part corresponding to elastic deformation of the vortex is perfectly reversible.

The elastic deformation of the vortex configuration is shown in FIGS. 5*a* and 5*c*.

For a negative field Hx stronger than −Hs, in other words applied along the −Ox direction, (FIG. 5*a*), the vortex core V is moved transversely relative to the field applied along the Oy direction. As soon as the field is no longer applied, the vortex core returns to the initial position as shown in FIG. 5*b* with a fully elastic and reversible behaviour. In other words, the vortex core V is translated by a vector T relative to the centre CV of the layer 2. The vortex core V moves so as to facilitate orientation of the average magnetisation of the vortex along the direction of the field Hx (i.e. in this case the bottom zone of the vortex in which magnetisation is directed preferentially along the Hx field becomes larger).

For a field Hx that is positive and less than the cancellation field Hs and is applied along the OX direction (FIG. 5*c*), the vortex core CV moves transversely relative to the field applied along the −Oy direction. As soon as the field is no longer applied, the vortex core returns to the initial position as shown in FIG. 5*b*, following a fully elastic and reversible behaviour. In other words, the vortex core V is translated by a vector −T relative to the centre CV of the layer 2. Once again, the vortex core V moves to improve the orientation of the average magnetisation of the vortex along the direction of the field Hx (i.e. in this case the top zone of the vortex in which magnetisation is preferentially directed along the Hx field becomes larger).

The average magnetisation of the non-deformed magnetic configuration (FIG. 5*b*) is practically zero due to its cylindrical symmetry.

Deformation of the vortex along one of the two directions results in a modification of the average magnetisation along −Ox or +Ox.

According to the invention, the aim is to obtain a fairly easy vortex deformation, in other words that does not required excessive field intensities.

This can be achieved by obtaining the steepest possible gradient of the elastic deformation curve as shown in FIG. 4 (along arrows F1). This slope is inversely proportional to the exchange stiffness constant A. The susceptibility of the vortex can then be adjusted by varying the exchange stiffness constant of the material(s) used for the reference layer 2. The higher the exchange stiffness constant, the stiffer the vortex becomes. Note that this exchange stiffness constant is proportional to the order temperature (in other words the Curie temperature) of the ferromagnetic material.

Therefore, materials for which the exchange stiffness constant is not too high will be chosen in preference. This exchange stiffness constant is related to the Curie temperature of the material. To achieve this aim, it is helpful to use a composite reference layer composed of at least two layers with one layer giving a strong magnetoresistance close to the spacer (for example a CoFeB layer between 1 nm and 3 nm thick in the case of an MgO spacer) and a layer with lower exchange stiffness constant when further away from the spacer (for example an NiFe layer for which the Curie temperature is lower or even an NiFeX alloy layer where X represents a non-magnetic element such as Ta, Cu, Hf, Zr, Cr, V in a proportion of the order of 2 to 20% known to reduce the Curie temperature of the alloy). For this material with a low Curie temperature, it is advantageous to choose a material for which the Curie temperature is typically of the same order as or is less than the Curie temperature of the Permalloy (of the order of 800K) but is higher than the maximum temperature that can be expected during normal operation of the device, in other words typically 280° C. or about 550K. This choice provides a means of generating a more easily deformable vortex in which weaker write fields can be used and higher amplitude magnetoresistance signals can be obtained. Nevertheless it is important that the magnetic layer 2 does not become completely paramagnetic due to overheating during operation of the device to avoid losing the vortex configuration.

The magnetic device then comprises a storage layer 4 separated from the reference layer 2 by a spacer 3.

Deformation of the vortex in one of the two directions results in a modification to the average magnetisation and consequently a change in resistance due to the magnetoresistive effect, either as a result of Giant MagnetoResistance (GMR) effects as in the case of spin valves, or Tunnel MagnetoResistance (TMR) effects, in the same way as for magnetic tunnel junctions MTJs.

The spacer 3 may be a tunnel barrier, preferably made of magnesium oxide MgO; more generally, the tunnel barrier may be made from a group including aluminium oxide $AlO_x$, titanium oxide $TiO_x$ or $SrTiO_3$, Hafnium oxide and magnesium oxide MgO. The result obtained is then a variation in the amplitude of the magnetoresistance between 100 and 600%, between parallel and anti-parallel magnetisation alignment configurations. It is important to note that when the reference layer 2 is in vortex configuration, the useful magnetoresistance is not the total magnetoresistance amplitude between the parallel and anti-parallel alignment but is only a fraction of this magnetoresistance given by the integral of scalar products of local magnetisations of reference layer 2 and storage layer 4 facing each other through the spacer 3, over the area of the pillar. Thus, the useful magnetoresistance may be much lower than the total amplitude of the magnetoresistance (for example between only 20 to 120% while the total magnetoresistance between parallel and anti-parallel alignment is from 100 to 600%). This magnetoresistance fraction will increase as the vortex of the reference layer 2 under a field becomes more deformable.

According to one preferred embodiment of the invention, the spacer 3 may be made in the form of an insulating layer (for example an alumina insulating oxide layer with a typical thickness of 1.5 to 3 nm) comprising a conducting contact at its centre (for example a 10 to 30 nm diameter metal bridge made of copper). Since in this case the current is concentrated at the centre of the pillar at which the conducting bridge is located, the result obtained when the vortex core moves is that the variation of the magnetoresistance amplitude between the perfectly parallel and perfectly anti-parallel alignments of the magnetisations represents a larger fraction of the magnetoresistance amplitude than the variation when there is no metal bridge. For example, if the tunnel magnetoresistance amplitude between parallel and anti-parallel alignments is between 100% and 600%, the magnetoresistance amplitude that can be obtained with the vortex configuration in the presence of a copper metallic bridge at the centre of the pillar may be from 90 to 560%. In placing the conducting zone at the centre, the vortex deformation can change the reference layer from a practically zero average magnetisation (symmetric vortex) to a magnetisation for which the direction will be marked more strongly at the centre of the reference layer (along the Ox or −Ox direction depending on the direction of the Hx field); it is precisely this magnetisation strongly marked at the centre of the reference layer that will result in a very strong variation in the magnetoresistance amplitude between the non-deformed state of the vortex of the reference layer 2 and the deformed state of the vortex. However, to obtain this effect on the amplitude, the vortex core (see reference V in FIGS. 5a to 5c) must be eccentric from the centre CV of the reference layer 2 by a distance T greater than the radius of the vortex core V (in other words the radius of the part of the vortex for which the magnetisation is significantly outside the plane of the reference layer 2).

Alternately, the spacer 3 may be composed of a semiconductor or a metal.

The spacer 3 can also be made from a heterogeneous metal/oxide layer such as a confined current paths layer composed of an insulating barrier, for example made of 2 nm thick alumina, through which conducting channels are formed, for example made of copper with a nanometric diameter typically between 1 and 4 nm.

The storage layer 4 is a magnetic layer that has a variable magnetisation direction. This storage layer 4 may be a magnetic single layer or a stack of layers. The storage layer 4 may for example be composed of a stack of layers comprising:

a layer composed of a ferromagnetic material with a cubic face-centred crystallographic structure in contact with the antiferromagnetic pinning layer 5;

an amorphous or quasi-amorphous transition layer in contact with the ferromagnetic layer with a cubic face-centred crystallographic structure;

a ferromagnetic layer with a cubic face-centred crystallographic structure in contact with the spacer 3.

In the example in FIG. 3, the storage layer 4 may for example be a multi-layer of the (1.5 nm CoFeB ferromagnetic layer/0.3 nm Ta amorphous layer/2 nm NiFe layer) type.

This type of storage layer is particularly interesting in the case in which the spacer 4 is a tunnel barrier based on MgO with a cubic centred crystallographic structure.

As for the reference layer, an attempt is made to obtain a fairly easy vortex deformation for the storage layer, in other words not requiring very high field intensities.

Therefore, materials that have an exchange stiffness constant that is not too high, in other words for which the Curie temperature is not too high, will be chosen preferentially. To achieve this, it is interesting to use a composite storage layer composed of at least two layers with one layer providing a high magnetoresistance close to the spacer (for example a CoFeB layer in the case of an MgO spacer) and a layer with a lower exchange stiffness constant further away from the spacer (for example an NiFe layer for which the Curie temperature is lower).

Obviously, the characteristics of the storage layer are only given here as a guideline, and those skilled in the art will be capable of adapting the invention to other types of storage layer.

The magnetic device then comprises a synthetic antiferromagnetic layer 5 in contact with the storage layer 4, that traps the magnetisation direction of the storage layer 4 in standby and at the time of the read (in other words at any time apart from during writing itself), so that the magnetisation direction of the storage layer 4 can be released during writing. The blockage temperature at the write time scale of the antiferromagnetic layer 5 is preferably sufficiently high so that if there is no heating, the antiferromagnetic layer 5 traps the magnetisation direction of the storage layer 4. This write time scale corresponds to the characteristic duration of the write event, typically given by the duration during which the memory element is heated during writing. This write time scale corresponds to the characteristic duration of the write event, typically given by the duration during which the memory element is heated during writing. In MRAM applications, this time scale is typically of the order of 5 to 20 ns. It is also known that as the heating time scale is reduced, the blocking temperature of the antiferromagnetic layer at the time scale considered approaches the Néel temperature of the antiferromagnetic material. However, this blocking temperature at the write time scale must not be too high so that it is not too difficult to release the magnetisation direction of the storage layer 4. Thus, the antiferromagnetic layer 5 preferably has a blocking temperature at the write time scale equal to between 200 and 300° C. For example, the antiferromagnetic layer 5 may be made from an iridium-manganese alloy particularly with an atomic composition close to Ir20Mn80, iron-manganese particularly with an atomic composition close to Fe50Mn50, nickel-manganese particularly with an atomic composition close to Ni50Mn50 or an iridium-manganese-chromium alloy with an atomic percent of chromium equal to between 10 and 25%.

The storage layer 4 may be a layer in a single domain magnetic configuration or, like the reference layer 2, it may be in a vortex configuration; especially advantageously, the vortex configuration of the storage layer 4 makes it possible to make more than two storage levels in a single memory point (i.e. store more than two bits of information ("0" or "1") in a single memory point); we will return to this advantage in more detail in the remainder of the description.

As for the reference layer 2, the thickness of the storage layer 4 (for a given radius) should be chosen in an appropriate manner so that it is in a stable single domain configuration or in a stable vortex state (see FIG. 2).

The different layers forming the memory point 1 are preferably approximately circular in shape such that the memory point is approximately cylindrical in shape. This cylindrical shape does not create any particular problem with the stability of the storage layer 4 at different temperatures, which in this case is achieved by interaction through the interface with the antiferromagnetic layer 5.

This cylindrical shape is also advantageous from an energy point of view to switch the magnetisation of the storage layer 4 at the time of write, once the antiferromagnetic pinning layer 5 is close to its Néel temperature. The cylindrical shape also favours formation of the vortex state in the reference layer 2.

It should be noted that a deformed vortex state can be pinned after application of a field in an antiferromagnetic pinning layer. For example, this has been demonstrated in the article "Imprinting vortices into Antiferromagnets" (J. Sort, G. Salazar-Alvarez and M. D. Baro, B. Dieny, A. Hoffmann and V. Novosad, J. Nogues, K. S. Buchanan, A. Bollero, Phys. Rev. Lett 97 (2006) 067201).

The synthetic antiferromagnetic layer 5 can trap the deformed vortex of the storage layer 4 during writing and can release the vortex configuration from the storage layer 4 during writing. The blocking temperature of the antiferromagnetic layer 5 at the write time scale is preferably high enough so that in the lack of any heating, the antiferromagnetic layer 5 traps the magnetisation direction of the storage layer 4.

Therefore after cooling under a field, the vortex core of the storage layer 4 is off-centred in the remanent state.

As mentioned above, the magnetic device according to the invention advantageously comprises several memory points each comprising a reference layer in the vortex state and a storage layer with thermally-assisted writing (preferably also in the vortex state) separated from each other by a spacer.

Advantageously, it is preferable that all vortices in reference layers (and possibly storage layers) should have the same chirality (in other words the same direction of rotation that may be clockwise or anticlockwise using the magnetisation of the vortex core in the direction towards the top of the layer as reference), so that the device according to the invention can operate at the scale of a set of memory points.

One embodiment of this initialisation phase is shown in FIGS. 6a to 6c.

These vortices can be initialised by applying a field H outside the plane of the module, decreasing progressively from out-of-plane saturation (H=Hsat as shown in FIG. 6a) down to zero (H=0 as shown in FIG. 6c), so that they all have the same chirality. This field H is combined with Amperian magnetic field $H_A$ created by a current J passing through each magnetoresistive stack forming a memory point; the current J is injected perpendicular to the layers forming said point. The local magnetisation on the reference layer is shown by arrows F. The Amperian field created by the current J has a symmetry of revolution as shown by arrow $H_A$ in FIGS. 6a-c. This symmetry of revolution can facilitate the formation of a magnetisation vortex state of the magnetic layer for which the chirality is determined by the direction of the current passing through the element. When the saturation field is applied outside the plane, magnetisation is globally outside the plane. As the magnetic field H is progressively reduced, the local magnetisation progressively drops back inside the plane of the layer while becoming aligned on the Amperian field $H_A$, magnetisation of the vortex core remaining oriented along the direction of the saturation field Hsat. This progressive change from the out-of-plane saturation magnetisation for H=Hsat to the vortex configuration for H=0 passing through all intermediate fields between Hsat and 0 is shown in FIGS. 6a,b,c.

Even a weak Amperian field is sufficient to define the chirality of the vortex, because of the out-of-plane field H that reduces the energy barrier separating the two vortex states with opposite chirality. This initialisation process is applied on each memory point such that each reference layer (and possibly each storage layer) in the vortex state has the same chirality.

Another method of imposing the same chirality on all vortices consists of making all magnetoresistive elements, or in any case all magnetic layers that are to be put in a vortex configuration, have a quasi-cylindrical shape comprising a slight flat (see flat ME in FIGS. 7a to 7c) or a slight asymmetry of rotation, for example a half-disk shape adjacent to a half-ellipse with a small shape factor (for example between 1.1 and 1.3), the major axis of the semi-ellipse being adjacent to the diameter of the half-disk. By applying a saturating field in the plane parallel to the flat or to the major axis of the ellipse and then gradually reducing this field to 0, a vortex state is created for which the chirality is determined by the fact that the magnetisation along the flat or on the side of the elliptical part of the structure is approximately oriented along the saturating field initially applied in the plane. This is diagrammatically shown in FIGS. 7a (application of a saturating field parallel to the flat ME), 7b (reduction of the saturation field), 7c (cancellation of the saturation field and creation of a vortex state with controlled chirality).

FIG. 8 diagrammatically shows the write means of device 1 in FIG. 3 according to a first embodiment of the invention.

The magnetic device 1 comprises a transistor 12 that is conducting in write mode, to write information in the storage layer 4. Furthermore, the magnetic device 1 comprises a conducting line 13 located below the magnetic stack. This conducting line 13 is arranged such that when an electric current passes through it, this line creates a magnetic field Hx at the storage layer that will enable writing information in the storage layer 4. During writing, the transistor 12 is in conducting mode such that a current can circulate through the stack causing heating of the storage layer 4 and the antiferromagnetic layer 5 by the Joule effect. This heating will increase the temperature to make it equal to or higher than the blocking temperature of the antiferromagnetic layer 5 at the write time scale. It should be noted that in write mode, the antiferromagnetic layer 5 should be heated to a temperature called the blocking temperature (that might be less than the Néel temperature), such that the magnetisation direction of the storage layer 4 is no longer pinned. Since the unpinning effect of the magnetisation of the storage layer under the effect of heating is a thermally activated effect, the blocking temperature depends on the duration of the heating pulse. This is why is it always specified that the blocking temperature considered is the temperature at the write time scale.

The magnetic field Hx is created by the first conductor 13 at the same time. This magnetic field Hx acts on the storage layer 4, which is no longer pinned; FIGS. 9a to 9c illustrate the action of the field Hx in the case of a storage layer 4 in an initial configuration in the vortex state.

If Hs' denotes the cancellation field of the vortex of the storage layer 4, when the component of the field Hx located above the storage layer is negative and more than –Hs (in other words a field applied along the –Ox direction and with a norm less than Hs'—FIG. 8a), the vortex core V' moves transversally relative to the field applied along the Oy direction. In other words, the vortex core V is translated by a vector T' from the centre CV' of the storage layer 4. The vortex core V moves so as to facilitate orientation of the average magnetisation of the vortex along the direction of the field Hx (i.e. in this case the low zone of the vortex in which magnetisation is preferably directed along the field Hx becomes larger).

For a positive field Hx weaker than the cancellation field Hs' (in other words a field applied along the Ox direction with norm less than Hs'—FIG. 9c), the vortex core CV moves transversally from the applied field along the −Oy direction. In other words, the vortex core V is translated by a vector −T' from the centre CV' of the storage layer 4. Once again, the vortex core V moves so as to facilitate orientation of the average magnetisation of the vortex along the direction of the field Hx (i.e. in this case the high zone of the vortex in which the magnetisation is preferably directed along the field Hx becomes larger).

The average magnetisation of the non-deformed magnetic configuration (FIG. 9b) is practically zero due to its cylindrical symmetry.

Deformation of the vortex along one of the two directions causes a modification of the average magnetisation along −Ox or +Ox.

Therefore, it can be seen that three different states of the vortex of the storage layer can be obtained by controlling a magnetic field Hx:

a first non-deformed state (FIG. 9b) corresponding to state "0";

a second deformed state (FIG. 9a) corresponding to state "1";

a third deformed state (FIG. 9c) corresponding to state "−1".

In other words, it is possible to imprint more than two possible information states (i.e. such as known parallel or anti-parallel magnetisations in magnetic devices) in the storage layer 4, in this case the device 1 according to the invention being capable of storing three information levels (or states).

Once the magnetisation direction of the storage layer 4 has been put into the required state, the current that passes through the stack is cut off so that the stack can cool in the presence of the magnetic field and the current in the conductor 13 is then cut off to eliminate the applied field. Since the antiferromagnetic layer 5 has become antiferromagnetic again, it traps the local magnetisation direction of the storage layer 4 in a centred or off-centred vortex configuration similar to that existing when the storage layer was cooled under a field. This configuration is not precisely the same as the configuration during cooling because it is the result of an energy equilibrium between interface coupling with the antiferromagnetic layer, the exchange energy and the magnetostatic energy of the system. As the interface coupling between the ferromagnetic storage layer and the adjacent antiferromagnetic layer increases relative to the influence of the other energy terms, the pinned configuration will be more similar to the configuration existing during cooling under field.

Either a differential read or a dynamic read can then be made using the reference layer 3, to read the information contained in the storage layer In a sequential differential approach, the resistance levels of the magnetoresistive stack formed by the magnetic device for two different orientations of the resultant magnetisation direction (in other words averaged over the entire surface of the reference layer) of the reference layer 3 are compared. This is done by orienting the magnetisation direction of the reference layer 3 along a first predetermined direction, with a first magnetic field generated by a first current in the conductor 13; in other words, the vortex of the reference layer 3 is deformed along a predetermined direction (for example as shown in FIG. 5a). The resistance R1 of the magnetic device is then measured using a read current weaker than the heating current used at the time of writing, typically divided by a factor of 2. A second magnetic field generated by a second current in the conductor 13 along the direction opposite the first current is then applied, so as to orient the magnetisation direction of the reference layer 3 along the direction opposite the first predetermined direction (i.e. vortex deformation as shown in FIG. 5c). The resistance R2 of the magnetic device is then measured again. The preferred average magnetisation direction of the reference layer 3 is known after each current, because the directions of the applied magnetic fields are known. Consequently, the magnetisation direction of the storage layer 4 and therefore also the information contained in the storage layer 4 are deduced by comparing the resistance of the magnetic device with the first current and with the second current.

If R1<R2, then magnetisation of the storage layer (or its average resultant if the storage layer is itself in vortex with thermally-assisted writing) is oriented along the direction corresponding to the first predetermined direction;

If R1>R2, then magnetisation of the storage layer (or its average resultant if the storage layer is itself in vortex with thermally-assisted writing) is oriented along the direction opposite to the first predetermined direction.

As discussed above, the magnetic device according to the invention can discriminate more than two levels if the storage layer is used in the vortex state;

thus in addition to the configurations denoted "1" and "−1" in FIGS. 9a and 9c, it is possible to have a "0" information level corresponding to that in FIG. 9b with the non-deformed vortex; the method for reading such a device is exactly the same as that described previously according to the sequential differential approach; therefore two values of the resistances R1 and R2 are obtained. The procedure for discriminating the three states "0", "1" or "−1" is then as follows; three conditions will be possible in this case:

If 0<r<R2−R1, then the average resultant of the magnetisation of the storage layer is oriented along the direction corresponding to the first predetermined direction (state "1", the average magnetisation of the storage layer points towards the left as shown in FIG. 9a and in FIG. 8);

If abs(R1−R2)<r where "abs" denotes the "absolute value" function, then the average resultant of the magnetisation of the storage layer is quasi-null (state "0", the vortex of the storage layer is not deformed as it is in FIG. 9b); it should be noted that this resultant is never totally null because the vortex is never totally symmetric;

If 0<r<R1−R2, then the average resultant of the magnetisation of the storage layer is oriented along the direction corresponding to the second predetermined direction (state "−1", the average magnetisation of the storage layer points towards the right as in FIG. 9c).

In this case, r is a resistance threshold very much less than the difference between the resistances R1 and R2 for example defined as r=1/10*abs(R1−R2); this threshold value r takes account of the fact that the vortex of the storage layer is not necessarily perfectly symmetrical (case in which r is equal to 0). Consequently, the mathematical condition R1=R2 that would arise for a perfectly centred vortex and a perfectly symmetric displacement of the vortex of the read layer in the two sequential read steps is only possible with an uncertainty r.

For all multi-level storage products (i.e. storage of more than 2 states within a single memory point), it is preferable that the distribution of current circulating through the entire spacer should have an almost circular symmetry such that a position of the vortex core in the storage layer can be unambiguously associated with a resistance value of the magnetoresistive element. This is the case if the spacer is composed of a layer in which the lateral conductivity is as homogeneous as possible; in other words, the spacer will preferably be a tunnel barrier or a metallic spacer; the spacer may also be composed of an insulating layer through the centre of which a conducting bridge passes. On the other hand, with this embodiment, it will be more difficult to make the spacer from a layer with confined current paths, in other words an insulating layer through which conducting bridges penetrate and are distributed at random over its surface.

As mentioned above, the information contained in the storage layer 4 can also be read using a dynamic read.

Thus, the read speed of the magnetic device can be improved by reading the information in the storage layer dynamically. This is done by sending a current pulse through the conducting line 13, this current pulse creating a magnetic field pulse at the reference layer 2. The field pulse causes an oscillation of the vortex core of the reference layer 2 that generates a voltage oscillation at the terminals of the magnetoresistive element (stack formed by the layers 2, 3 and 4) when a current J passes through this element (opening the transistor 12).

The voltage pulse thus created may have a positive voltage peak (FIG. 10a) or a negative voltage peak (FIG. 10b), depending on whether the magnetisation resultants of the storage and reference layers are parallel or anti-parallel. Therefore, the sign of this voltage peak provides information about the magnetisation direction of the storage layer more quickly.

For the orientation of Hx shown in FIG. 8, the voltage pulse will be as shown in FIG. 10b (voltage drop at the time of the field pulse) if magnetisation of the storage layer points towards the left (i.e. its magnetisation resultant is approximately parallel to the magnetisation resultant of the reference layer at the time of the field pulse).

For the orientation of Hx shown in FIG. 8, the voltage pulse will be as shown in FIG. 10a (increase in voltage at the time of the field pulse) if the magnetisation of the storage layer is pointing towards the right (i.e. its magnetisation resultant is approximately anti-parallel to the magnetisation resultant of the reference layer at the time of the field pulse).

For example, an integration system can then be used to determine the orientation of the storage layer using the sign of the average voltage signal following the field pulse.

As before, the magnetic device according to the invention can also be read dynamically when the storage layer of this magnetic device is in a multi-level vortex configuration, for example three levels "0", "1" and "−1" as shown in FIGS. 9a to 9c.

The principle to achieve this is very similar to a dynamic read with two levels. A current pulse is sent in the bit conducting line 13 generating a magnetic field pulse and the variation of the voltage at the terminals of the magnetoresistive stack is monitored dynamically, a given current with amplitude J passing through the magnetoresistive stack.

The temporal shape of the voltage will vary depending on the magnetic state of the storage layer 4; therefore the magnetisation direction of the storage layer can be determined more quickly knowing the shape of the voltage signal.

The orientation of Hx shown in FIG. 8 will be conducive to a resultant vortex magnetisation of the reference layer oriented towards the field Hx when it is above the magnetoresistive stack (i.e. a deformation of the type shown in FIG. 6a and a resultant being oriented globally towards the left), during application of the field pulse.

Thus, for the orientation of Hx shown in FIG. 8, the voltage pulse will be as shown in FIG. 11a (voltage drop at the beginning of the field pulse), if the resultant magnetisation of the storage layer is oriented towards the left (i.e. there is a local alignment of magnetisations over practically the entire areas of the two storage and reference layers that occurs and is at the maximum at the time of the field pulse) as shown in FIG. 9a (level "1").

For the orientation of Hx shown in FIG. 8, the voltage pulse will be as shown in FIG. 11b (minimum voltage then increase in the voltage at the time of the field pulse and then minimum voltage again) if the magnetisation of the storage layer is in the non-deformed vortex configuration (i.e. before the pulse there is a local alignment of magnetisations over almost the entire area of the two storage and reference layers and the voltage then increases and is a maximum at the time of the field pulse, and then again after the end of the pulse, there is a local alignment of the magnetisations over practically the entire surface areas of the two storage and reference layers), as shown in FIG. 9b (level "0"); the voltage peak corresponds to an increase in the magnetoresistance when the vortex configuration of the reference layer is deformed.

For the Hx orientation shown in FIG. 8, the voltage pulse will be as shown in FIG. 11c (increase in voltage at the beginning of the field pulse) if the resultant magnetisation of the storage layer is oriented towards the right (i.e. there are local anti-parallel magnetisations on practically the entire area of the two storage and reference layers at the time of the pulse field) as shown in FIG. 9c (level "−1").

Therefore, the different states of the storage layer can be discriminated by an analysis of the voltage pulse response.

As mentioned before, with the vortex configuration of the storage layer 4, more than two storage layers can particularly advantageously be made in a single memory point (i.e. more than two "0" or "1" information states can be stored in a single memory point); we have demonstrated that this layer can store three storage levels by using a field Hx component and a displacement of the vortex core transverse to the direction of this field. It can then be understood that the number of storage levels within the storage layer 4 initially in the non-deformed vortex state can be increased even further by using two field components with different directions, particularly perpendicular directions. FIGS. 12a to 12e show this principle in the case of two field Hx and Hy components along perpendicular directions Ox and Oy respectively; each Hx component can be oriented along the Ox or −Ox direction and each Hy component can be oriented along the Oy or −Oy direction.

Therefore, it can be seen that five different states of the vortex of the storage layer can be obtained with these two magnetic field Hx and Hy components:

a first nondeformed state shown in FIG. 12e (corresponding to FIG. 9b) defining a state "0" for null Hx and Hy components;

a second state deformed upwards as shown in FIG. 12a (corresponding to FIG. 9a) defining a state "2" for an Hx component being oriented towards −Ox and a null Hy component;

a third state deformed downwards as shown in FIG. 12c (corresponding to FIG. 9c) defining a state "−2" for an Hx component being oriented towards Ox and a null Hy component;

a fourth state deformed towards the left as shown in FIG. 12b defining a state "1" for an Hy component being oriented towards −Oy and a null Hx component;

a fifth state deformed towards the right as shown in FIG. 12d defining a state "−1" for an Hy component being oriented towards Oy and a null Hx component.

Writing/read means for these different states are shown in FIG. 13 according to a second embodiment of the invention.

The device 1 is identical to the device disclosed with reference to FIG. 3 but two orthogonal conducting lines 13

(identical to line 13 as shown in FIG. 8) and 14 have been added to create two orthogonal magnetic field components Hx and Hy, to write the different states shown in FIGS. 12a to 12e. The conducting lines 13 and 14 are preferentially positioned below and above the lines making it possible to inject a current in the magnetoresistive stack when the transistor 12 is open.

Information is written in the storage layer 4 by sending a current through the magnetoresistive stack, the transistor 12 being conducting. The stack then warms up to a temperature higher than the blocking temperature of the antiferromagnetic layer 5 at the write time scale, such that the magnetisation direction of the storage layer 4 is no longer pinned.

At the same time, the required magnetic field pair (Hx, Hy) is created to write one of the five levels as shown in FIGS. 12a to 12e.

The Hx magnetic field is created by injecting a current into the first conducting line 13 and the Hy magnetic field is created by injecting a current into the second conducting line 14 perpendicular to the first conducting line 13.

The magnetic fields Hx and Hy act on the storage layer 4 along the Ox and Oy directions respectively, the Oy direction no longer being pinned; FIGS. 12a to 12e illustrate the action of the Hx and Hy fields in the case of a storage layer 4 in an initial configuration in the vortex state.

Once the resultant magnetisation direction of the storage layer 4 has been set to the required state, the current passing through the stack is cut off to enable the stack to cool in the presence of the magnetic field and the current in the conductor 13 or in the conductor 14 is then cut off to eliminate the applied field. Since the antiferromagnetic layer 5 has become antiferromagnetic again, it traps the magnetisation configuration of the storage layer 4 in a state close to the state that it was in during cooling under field. As explained above, the pinned configuration corresponds to an equilibrium between the interface coupling energy between the ferromagnetic layer and the antiferromagnetic layer (energy commonly called exchange anisotropy), exchange and magnetostatic energy. The configuration pinned in null field and at ambient temperature only corresponds to the configuration during cooling under field when the interface coupling energy is very high compared with the influence of other energy terms. If the coupling energy is not much higher than other energy terms, then the configuration will be intermediate between the configuration existing during cooling under field and the centred vortex configuration.

One of the 5 configurations stored in the storage layer 4 may be read sequentially by successively putting the reference layer 2 in the five possible configurations similar to those disclosed for the storage layer. This is done by applying the Hx or Hy field component to put the reference layer 2 into the required configuration, and injecting a read current much weaker than the heating current used at the time of writing, typically divided by a factor of 2.

The resistance of the magnetoresistive stack is measured in each of the configurations. The configuration of the reference layer 2 that results in the lowest resistance (among the five resistances obtained) is the one that is stored in storage layer 4.

It will be understood that the precision of the device will be even more efficient if the reference layer and the storage layer are made identical, in other words if both layers have a configuration in the vortex state, and if they have the same thickness and are made from the same material (the only difference lying in the fact that the storage layer is coupled with an antiferromagnetic pinning layer while the reference layer is not pinned); in other words, magnetisations of the two reference and storage layers react to the applied magnetic field in the same way above the blocking temperature of the antiferromagnetic pinning layer.

One of the 5 dynamically stored levels can also be discriminated by applying two orthogonal field pulses one after the other.

For one of its pulses, the vortex core in the reference layer will oscillate in the direction parallel to the off-centre shift of the vortex core of the storage layer. On the contrary, for the other pulse the vortex core will oscillate transverse to the off-centre shift of the vortex core of the storage layer. In the first case (oscillation in line with the off-centre shift), voltage oscillations will be very similar to those described for the 3-level read as disclosed with reference to FIGS. 11a to 11c. On the contrary, for the other pulse, there will be almost no voltage variation related to the pulse. Furthermore, if the storage layer is in state "0" (i.e. practically without any off-centre shift), then the two field pulses will result in the same voltage response shape (typically like that shown in FIG. 11b). Thus, the magnetic state of the storage layer can be known unambiguously by combining information from the two field pulses.

Another way of reading consists of generating a rotating field with constant modulus of the order of the write field on the magnetoresistive element and particularly on the reference layer, using sinusoidal and quadrature currents circulating in the conducting lines 13 and 14 in FIG. 13. This rotating field will rotate the vortex core of the reference layer along a circular trajectory centred on the reference layer centre. This rotating movement of the vortex core will generate a quasi-sinusoidal oscillation of the resistance of the magnetoresistive element with minimum resistance obtained when the vortex core of the reference layer moves close to the vortex core of the storage layer. Thus, the position of the vortex core in the storage layer and thus the information written in the storage layer can be determined by measuring the resistance oscillation phase. If the storage layer is in a centred vortex state (FIG. 12e), rotation of the vortex core of the reference layer is not accompanied by any change in the resistance of the magnetoresistive stack, so that the logical state "0" can be discriminated from other states.

It is possible to generalise by storing even more possible states in the storage layer corresponding to different off-centre shift radii of the vortex core and different off-centre shift angles.

With the embodiment disclosed above for five storable levels in the storage layer, writing consisted of using one of the Hx or Hy perpendicular components of the magnetic field. However, an Hx and an Hy component of the magnetic field can be applied at the same time, while heating to increase the temperature to above the blocking temperature of the antiferromagnetic layer by a current passing through the magnetoresistive stack. In other words, the position of the vortex core on a circle with a given radius can be varied by correctly choosing the pair of applied magnetic fields (Hx, Hy).

FIG. 14 shows an example of a storage layer 4 with eight storage levels. The different pairs of fields (Hx, Hy) may for example be characterised by the same amplitude and uniformly spaced directions in the plane of the layers (in this case there are 8 possible directions), such that when the stack is heated, the vortex core can be in eight different positions V1 to V8 on a circle CE. This will correspond to 8 off-centre shift situations of the vortex core uniformly distributed on the circle CE centred on the centre CV of the storage layer 4.

This operation may be repeated with a second amplitude (for example smaller than the first amplitude) of the write field that will lead to a smaller off-centre shift of the vortex core than before. This operation is shown in FIG. 15.

When the stack is heated, the vortex core may be in 16 different positions:

eight positions V1 to V8 uniformly distributed on the circle CE with radius R1. This will correspond to 8 off-centre shift situations of the vortex core as described with reference to FIG. 14;

eight positions V'1 to V'8 uniformly distributed on a circle CE' with radius R2 less than R1.

There are thus 2*8=16 possible states stored in the storage layer 4.

Then there is no thermal assistance when reading in the case in FIG. 14 as in the case in FIG. 15, such that the storage layer hardly changes under the effect of the applied field due to pinning by the antiferromagnetic layer; in other words, the injected read current is less than the heating current used at the time of writing, typically the heating current is divided by a factor of 2.

The same sequence of rotating fields is then applied in 8 steps of 45° and with two different moduli (or amplitudes). This moves the vortex of the read layer. Resistance is minimum when the vortex of the reference layer and the vortex of the storage layer correspond. The stored state is thus detected by this minimum resistance.

Obviously, the invention is not limited to the disclosed embodiments with reference to the figures, and variants can be envisaged without going outside the scope of the invention. In particular, the materials and thicknesses chosen to make the reference layers, the storage layers and the spacers are only given for illustrative purposes and other materials or thicknesses could be used.

The invention claimed is:

1. Thermally-assisted magnetic writing device comprising at least one magnetic element including:
    a first magnetic layer, the first magnetic layer having a stable vortex magnetisation configuration;
    a magnetic field creating device to create a magnetic field to reversibly move a vortex core in a plane of said first magnetic layer;
    a second magnetic layer, the second magnetic layer having a variable magnetisation configuration;
    a non-magnetic spacer that separates and magnetically decouples the first magnetic layer and the second magnetic layer;
    an antiferromagnetic pinning layer in contact with the second magnetic layer, the antiferromagnetic layer being capable of pinning the magnetisation configuration of the second magnetic layer, said second magnetic layer having at least two storage levels corresponding to two pinned magnetisation configurations, and
    a heating device to heat said antiferromagnetic pinning layer such that when heated, the temperature of said antiferromagnetic pinning layer exceeds its blocking temperature such that the magnetisation configuration of said second magnetic layer is no longer pinned when warm,
    wherein the second magnetic layer has a stable vortex magnetisation configuration.

2. The thermally-assisted magnetic writing device according to claim 1, wherein said second magnetic layer is an essentially single domain magnetic layer.

3. The thermally-assisted magnetic writing device according to claim 1, wherein vortices of said first magnetic layer and said second magnetic layer have the same chirality.

4. The thermally-assisted magnetic writing device according to claim 1, wherein said second magnetic layer has more than two storage levels, each storage level corresponding to a pinned magnetisation configuration.

5. The thermally-assisted magnetic writing device according to claim 4, wherein said second magnetic layer has three storage levels.

6. The thermally-assisted magnetic writing device according to claim 1, wherein said magnetic field creating device to create a magnetic field creates two variable non-parallel components Hx and Hy of the magnetic field, simultaneous application of the field components Hx and By being capable of moving the vortex core of said second magnetic layer in the plane of said second magnetic layer when the second magnetic layer is not pinned, each pair of components Hx and Hy being associated with one storage level.

7. The thermally-assisted magnetic writing device according to claim 1, wherein a thicknesses of said first magnetic layer and said second magnetic layer are the same and said first and second magnetic layers are made from the same material.

8. The thermally-assisted magnetic writing device according to claim 1, comprising a plurality of the magnetic elements each forming a memory point, the vortices of the first magnetic layers of said memory points all having the same chirality.

9. The thermally-assisted magnetic writing device according to claim 1, wherein the magnetic element forms a memory point and wherein for a given radius of said memory point, a thickness of said first magnetic layer is chosen such that said first magnetic layer has a stable vortex configuration magnetisation.

10. The thermally-assisted magnetic writing device according to claim 1, wherein the Curie temperature of said first magnetic layer is reduced over at least part of the thickness of the first magnetic layer to a value of less than 900K but more than 550K.

11. The thermally-assisted magnetic writing device according to claim 1, wherein said first magnetic layer comprises a first sub-layer in contact with said spacer and a second sub-layer, the first sub-layer having a higher Curie temperature than the second sub-layer further from said spacer.

12. The thermally-assisted magnetic writing device according to claim 11, wherein said first magnetic layer is a composite layer composed of at least two sub-layers including a CoFeB sub-layer in contact with the spacer made of MgO and a sub-layer at a lower Curie temperature further from the spacer such as an NiFe or an NiFeX alloy sub-layer where X represents a non-magnetic element selected from the group consisting of Ta, Cu, Hf, Zr, Cr, and V in a proportion of the order of 2 to 20%.

13. The thermally-assisted magnetic writing device according to claim 1, wherein said spacer is made in one of the following forms:
    said spacer is a tunnel barrier;
    said spacer is made in the form of an insulating layer comprising a conducting contact at its centre;
    said spacer is made from a semiconducting or metallic material;
    said spacer is a heterogeneous metal/oxide layer with confined current paths composed of an insulating barrier through which conducting channels are formed.

14. The thermally-assisted magnetic writing device according to claim 13, wherein said spacer is made in the form of an insulating layer comprising a conducting contact at its centre, said magnetic field creating device to create a magnetic field being adapted to move said vortex core relative to the centre of said first magnetic layer by a distance exceeding the radius of said vortex core.

15. The thermally-assisted magnetic writing device according to claim 1, wherein said second magnetic layer comprises at least one stack formed from:
   a layer composed of a ferromagnetic material with a cubic face-centred crystallographic structure in contact with said antiferromagnetic layer;
   an amorphous or quasi-amorphous transition layer in contact with said ferromagnetic layer with a cubic face-centred crystallographic structure;
   a ferromagnetic layer with a cubic face-centred crystallographic structure.

16. The thermally-assisted magnetic writing device according to claim 1, wherein said at least one magnetic element is approximately cylindrical in shape.

17. Method of reading information contained in the second magnetic layer of the thermally-assisted magnetic writing device according to claim 1, said second magnetic layer having a stable vortex magnetisation configuration, said method comprising applying a rotating field on the magnetisation of the first magnetic layer, said rotating field causing oscillation of a stack resistance, and determining information written in the second magnetic layer starting from the phase and amplitude of said resistance oscillation.

* * * * *